(12) United States Patent
Rivaud et al.

(10) Patent No.: US 12,120,854 B2
(45) Date of Patent: Oct. 15, 2024

(54) HYBRID LIQUID AND AIR COOLING IN NETWORKING EQUIPMENT

(71) Applicant: Ciena Corporation, Hanover, MD (US)

(72) Inventors: Daniel Rivaud, Ottawa (CA); Peter Ajersch, Ottawa (CA); Michael Bishop, Ottawa (CA); Anthony Mayenburg, Carp (CA)

(73) Assignee: Ciena Corporation, Hanover, MD (US)

( * ) Notice: Subject to any disclaimer, the term of this patent is extended or adjusted under 35 U.S.C. 154(b) by 97 days.

(21) Appl. No.: 17/547,701

(22) Filed: Dec. 10, 2021

(65) Prior Publication Data

US 2023/0189482 A1 Jun. 15, 2023

(51) Int. Cl.
H05K 7/20 (2006.01)

(52) U.S. Cl.
CPC ......... *H05K 7/20736* (2013.01); *H05K 7/202* (2013.01); *H05K 7/20263* (2013.01)

(58) Field of Classification Search
CPC . H05K 7/20736; H05K 7/202; H05K 7/20263
See application file for complete search history.

(56) References Cited

U.S. PATENT DOCUMENTS

| | | | |
|---|---|---|---|
| 6,104,611 A | 8/2000 | Glover et al. | |
| 6,888,069 B1 | 5/2005 | Chen et al. | |
| 6,914,779 B2 * | 7/2005 | Askeland | H05K 7/20727 700/304 |
| 7,037,143 B2 | 5/2006 | Aziz et al. | |
| 7,203,063 B2 * | 4/2007 | Bash | H05K 7/20772 174/15.1 |
| 7,325,406 B2 * | 2/2008 | Lee | G06F 1/20 62/3.2 |
| 7,830,658 B2 * | 11/2010 | Van Andel | F28D 7/0041 165/104.34 |
| 7,957,132 B2 * | 6/2011 | Fried | F28D 15/0266 361/694 |
| 8,154,867 B2 | 4/2012 | Shearman et al. | |
| 8,184,526 B2 | 5/2012 | Duncan et al. | |
| 8,630,315 B2 | 1/2014 | Rivaud et al. | |

(Continued)

FOREIGN PATENT DOCUMENTS

JP 4023218 B2 12/2007

OTHER PUBLICATIONS

Mar. 30, 2023 International Search Report and Written Opinion issued in corresponding International Application No. PCT/US2022/052091.

*Primary Examiner* — Mandeep S Buttar
*Assistant Examiner* — Matthew Sinclair Muir
(74) *Attorney, Agent, or Firm* — Christopher L. Bernard; Clements Bernard Walker

(57) ABSTRACT

A networking hardware system includes a housing; a board located in the housing and comprising a plurality of components; a liquid cooled heat exchanger; and one or more fans disposed near the liquid cooled heat exchanger and configured to provide cool airflow from the liquid cooled heat exchanger to any of the plurality of components. The housing can be substantially sealed from an external environment and includes no air intake thereon, removing a need for higher powered fans and for air filtering for dust. The housing can include a faceplate with no air intake thereon, providing increased density for ports on the faceplate.

19 Claims, 13 Drawing Sheets

(56) References Cited

U.S. PATENT DOCUMENTS

| | | | |
|---|---|---|---|
| 8,776,161 B2 | 7/2014 | Gazier et al. | |
| 8,953,317 B2* | 2/2015 | Campbell | F28D 1/0477 |
| | | | 361/689 |
| 9,098,256 B2* | 8/2015 | Yen | G06F 1/20 |
| 9,301,421 B2* | 3/2016 | French, Jr. | H05K 7/20 |
| 9,603,289 B1 | 3/2017 | Shearman et al. | |
| 9,634,337 B2* | 4/2017 | Saito | H01M 8/04059 |
| 9,769,959 B2 | 9/2017 | Mayenburg et al. | |
| 9,847,752 B2 | 12/2017 | Rivaud et al. | |
| 9,854,710 B2* | 12/2017 | Hirai | H05K 5/0213 |
| 10,012,811 B2 | 7/2018 | Rivaud et al. | |
| 10,070,553 B2 | 9/2018 | Lee et al. | |
| 10,077,912 B2* | 9/2018 | Hong | F24F 3/14 |
| 10,247,895 B2 | 4/2019 | Rivaud et al. | |
| 10,674,241 B2 | 6/2020 | Rivaud et al. | |
| 10,684,661 B1* | 6/2020 | Thakar | G06F 1/20 |
| 10,736,227 B1 | 8/2020 | Rivaud et al. | |
| 10,855,623 B2 | 12/2020 | Estabrooks et al. | |
| 10,939,536 B1 | 3/2021 | O'Leary et al. | |
| 11,079,559 B2 | 8/2021 | Leclair et al. | |
| 2005/0124180 A1 | 6/2005 | Simonovich et al. | |
| 2005/0133252 A1 | 6/2005 | Ajersch et al. | |
| 2011/0277967 A1 | 11/2011 | Fried et al. | |
| 2013/0043007 A1* | 2/2013 | Hong | F25B 39/04 |
| | | | 165/104.26 |
| 2014/0366568 A1* | 12/2014 | Kim | F28F 17/005 |
| | | | 62/272 |
| 2015/0282389 A1 | 10/2015 | Iyengar et al. | |
| 2017/0164499 A1 | 6/2017 | Shearman et al. | |
| 2017/0214516 A1 | 7/2017 | Rivaud et al. | |
| 2017/0288678 A1 | 10/2017 | Estabrooks et al. | |
| 2017/0336903 A1 | 11/2017 | Rivaud et al. | |
| 2017/0352233 A1 | 12/2017 | Rivaud et al. | |
| 2018/0077080 A1 | 3/2018 | Gazier et al. | |
| 2019/0327126 A1 | 10/2019 | Rivaud et al. | |
| 2019/0327188 A1 | 10/2019 | Rivaud et al. | |
| 2020/0236813 A1 | 7/2020 | Shearman et al. | |
| 2021/0112683 A1 | 4/2021 | Mohajer et al. | |
| 2021/0132311 A1 | 5/2021 | Shearman et al. | |
| 2021/0136951 A1 | 5/2021 | Graham et al. | |
| 2021/0210894 A1 | 7/2021 | Rivaud et al. | |
| 2021/0239927 A1 | 8/2021 | Rivaud et al. | |
| 2021/0243915 A1 | 8/2021 | Saturley et al. | |

* cited by examiner

| | Velocity (m/s) |
|---|---|
| —— | 0 - 5 |
| ------ | 5 - 10 |
| ········ | 10 - 15 |

HYBRID LIQUID AND AIR COOLING IN NETWORKING EQUIPMENT

FIELD OF THE DISCLOSURE

The present disclosure generally relates to networking hardware. More particularly, the present disclosure relates to systems and methods for hybrid liquid and air cooling in networking equipment.

BACKGROUND OF THE DISCLOSURE

Networking equipment is physically realized as modules, chassis, shelves, pizza boxes, etc. that are mounted in a rack, frame, cabinet, etc. located in a data center, telecom hut, central office, point of presence, IT room, outside plant, etc. As described herein, networking equipment means any such equipment that performs electrical and/or optical functions and also includes computing, storage, and the like. Two of the main design constraints in networking equipment are space (i.e., real estate) and heat dissipation. Also, these two design constraints often clash as the conventional approach for heat dissipation is air cooling where an external housing of the networking equipment requires space for holes to allow external air to enter the housing. For example, typically, network elements are air cooled with front-to-rear airflow where fans inside the housing draw external air inward for cooling and expel the heated air from the rear. Of course, other implementations are also known, e.g., side-to-rear airflow or side-to-side airflow, but all of these implementations require space for air intake. The disadvantage of this approach is it takes up space on a faceplate which could otherwise be used for ports. A faceplate is a face of the network element—usually but not necessarily the front—where ports, such as pluggable optics are connected.

Another disadvantage of this approach is that pure air-cooled systems require larger and larger heat sinks as the networking equipment continues to push speed and capacity. Also, there is a requirement for improved air flow which often entails faster, louder fans and more faceplate area for air intake. The large airflow and pressures created draws dust through the network element and filtering such large amounts of air presents its own challenges. The required fan power scales with the cube of the air flow delivered, so a design improvement with 30% increase in air flow, for example, corresponds to 2.2 times increase in fan power. Furthermore, the space and cost requirements for the associated power systems become an increasingly significant part of an overall system.

Another approach is liquid cooling where liquid pipes provide the ingress/egress of fluid, and cold plates are connected directly to major heat-producing devices. However, there are smaller and lower-power devices that also need cooling, but liquid pipes to the complete set of those devices take too much room and add cost.

BRIEF SUMMARY OF THE DISCLOSURE

The present disclosure relates to systems and methods for hybrid liquid and air cooling in networking equipment. To address the design constraints associated with space and heat dissipation, the present disclosure utilizes sealed airflow within a network element housing, i.e., there is little or no air intake from the external environment, removing the space limitations for air intake on the external housing. To address heat dissipation of the sealed airflow, there is a liquid-cooled heatsink or radiator (evaporator) placed conveniently anywhere in the path of this airflow to move heat from the air to the liquid. Hence, this approach is described as hybrid liquid and air cooling. The benefits of this approach include fewer powered fans, lower total fan power, less acoustic noise, removal of the need for air filters and space for air intake, and increased density on the faceplate.

A networking hardware system includes a housing; a board located in the housing and comprising a plurality of components; a liquid cooled heat exchanger; and one or more fans disposed near the liquid cooled heat exchanger and configured to provide cool airflow from the liquid cooled heat exchanger to any of the plurality of components. The housing can be substantially sealed from an external environment and can includes no air intake thereon, removing a need for higher powered fans and for air filtering for dust. The housing can include a faceplate with no air intake thereon, providing increased density for ports on the faceplate. The housing can exclude air filtering for dust based on being substantially sealed from an external environment. The one or more fans can be configured to circulate the airflow in a closed loop. The closed loop can include pressure differential internal to the housing for the airflow.

The liquid cooled heat exchanger can include one of a heat sink with an optional base, a plurality of fins and a liquid cooling pipe therein, and the board and a liquid cooling pipe therein. The networking hardware system can further include one or more baffles located in an interior of the housing and positioned to direct the airflow within the housing. The one or more baffles can be positioned to exclude some of the plurality of components from the airflow. The networking hardware system can be a chassis having the housing and the board is a module inserted into the chassis.

The networking hardware system can be a rack-mounted unit. The one or more fans can operate at a variable speed based on ambient condition in the housing. The networking hardware system can further include a condensation detection and mitigation system. The condensation detection and mitigation system can include a temperature sensor that causes adjustments of the one or more fans to keep the liquid cooled heat exchanger above a dew point. The condensation detection and mitigation system can include a condensation collection system to maintain any condensate away from the plurality of components.

In another embodiment, a method of operating networking hardware includes steps of operating the networking hardware in a substantially sealed environment where, internal to a housing of the networking hardware, airflow is maintained and circulated therein; cooling the airflow at one or more paths internal to the housing, via one or more liquid cooled heat exchangers; and operating one or more fans disposed, each near the one or more liquid cooled heat exchangers, to provide cool airflow from the liquid cooled heat exchanger to any of a plurality of components internal to the housing. The steps can include directing the cool airflow from the one or more fans via one or more baffles located in the interior of the housing. The steps can include excluding any of more of a plurality of components from the airflow, via the one or more baffles. The steps can include operating the one or more fans at a variable speed based on ambient condition in the housing.

BRIEF DESCRIPTION OF THE DRAWINGS

The present disclosure is illustrated and described herein with reference to the various drawings, in which like reference numbers are used to denote like system components/ method steps, as appropriate, and in which.

DETAILED DESCRIPTION OF THE DISCLOSURE

The present disclosure relates to systems and methods for hybrid liquid and air cooling in networking equipment. To address the design constraints associated with space and heat dissipation, the present disclosure utilizes sealed airflow within a network element housing, i.e., there is little or no air intake from the external environment, removing the space limitations for air intake on the external housing. To address heat dissipation of the sealed airflow, there is a liquid-cooled heatsink or radiator (evaporator) placed conveniently anywhere in the path of this airflow to move heat from the air to the liquid. Hence, this approach is described as hybrid liquid and air cooling. The benefits of this approach include fewer powered fans, lower total fan power, less acoustic noise, removal of the need for air filters and space for air intake, and increased density on the faceplate.

Figure 1:
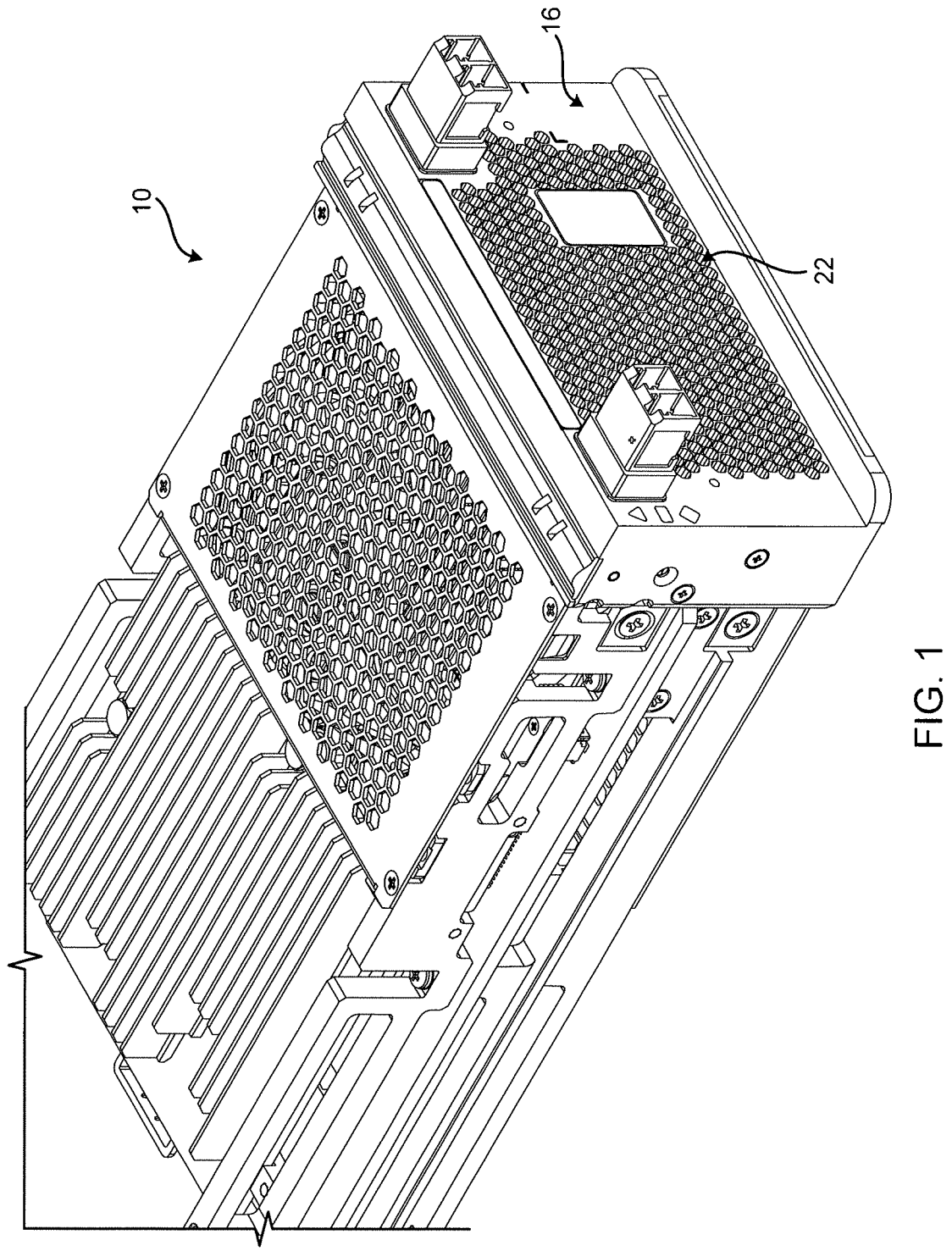
FIG. 1 is a perspective view of a networking module.
Figure 2:
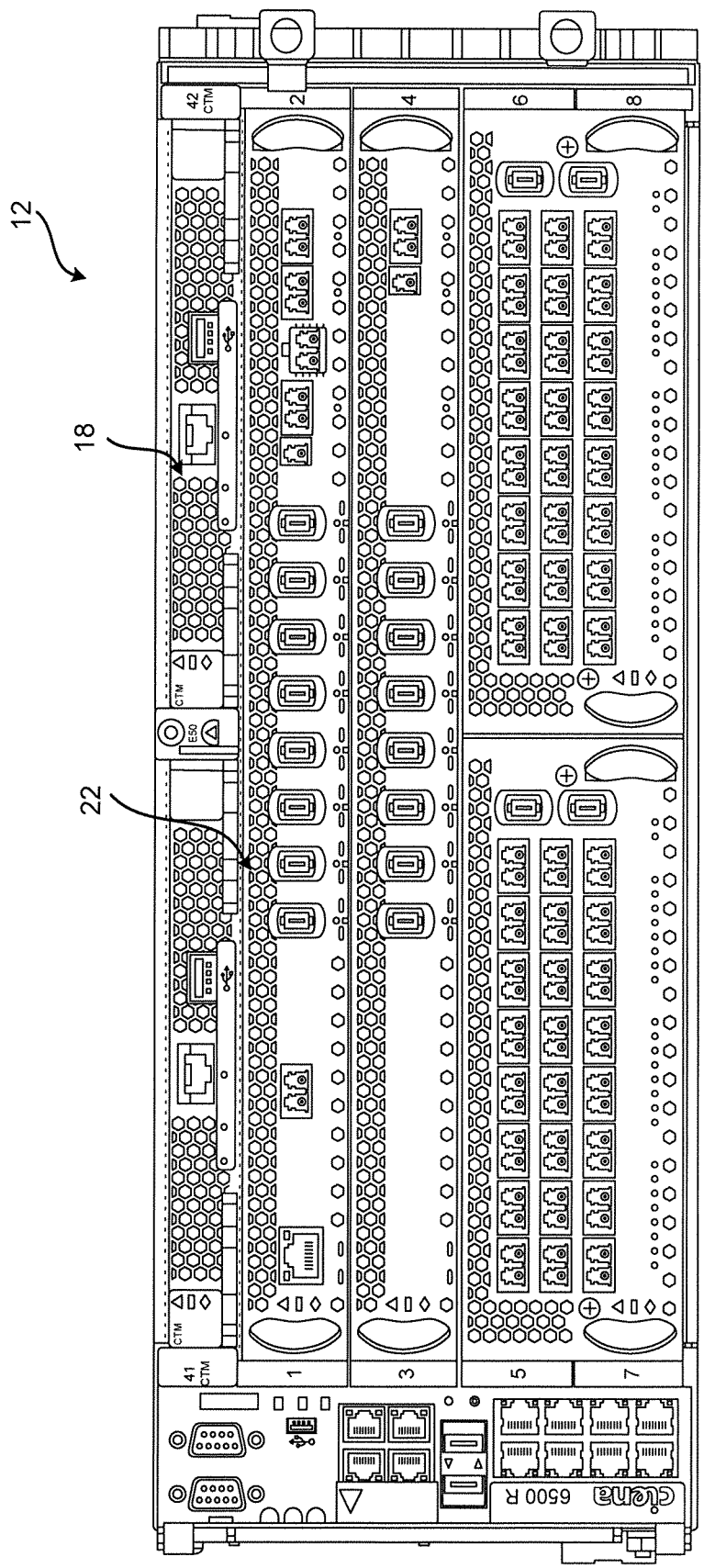
FIG. 2 is a front view of a networking shelf.
Figure 3:
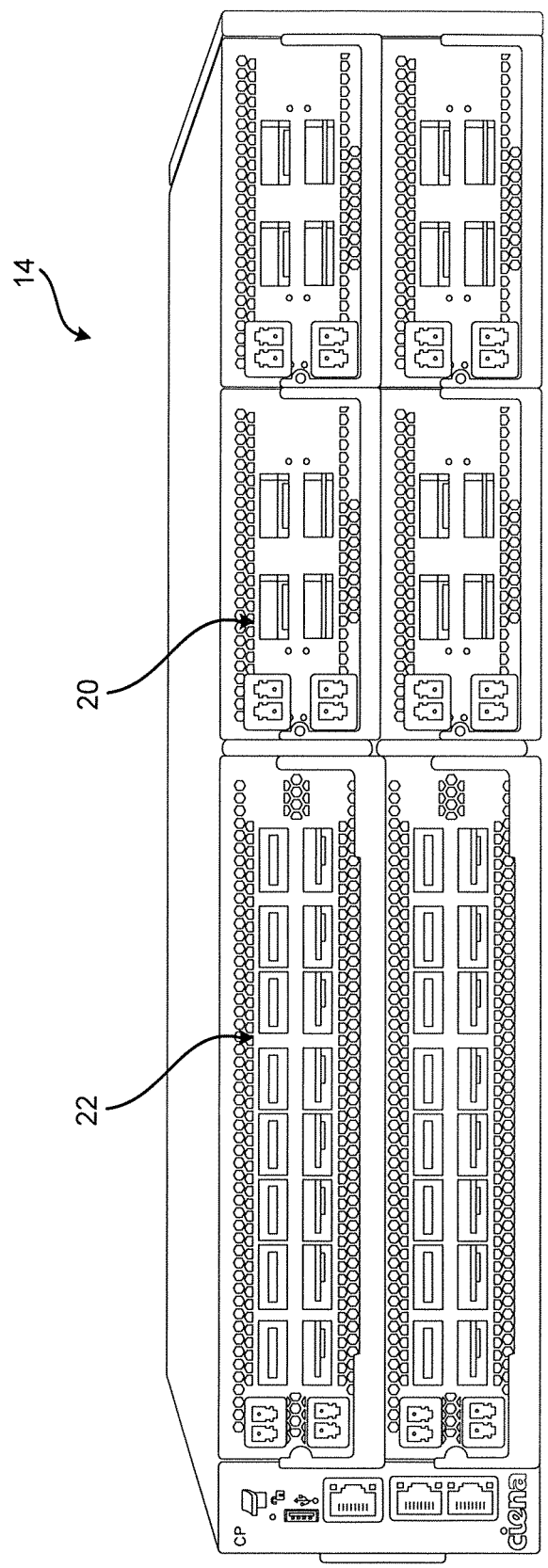
FIG. 3 is a front view of another networking shelf.

FIG. 1 is a perspective view of a networking module 10. FIG. 2 is a front view of a networking shelf 12, and FIG. 3 is a front view of a networking shelf 14. These are presented to illustrate faceplates 16, 18, 20. The networking module 10 includes significant space on its faceplate 16 for air intake, via holes 22. The networking shelves 14, 16 also require space on their faceplates 18, 20 for various holes 22. As can be seen, the holes 22 reduce the amount of space for ports.

The present disclosure includes a sealed housing for a networking module or networking shelf, without the holes, thereby increasing the space for ports or the like. The sealed housing can be on a module or card basis or for an entire shelf. For example, some deployments are referred to as pizza boxes which are generally 1-2 rack unit (RU) high integrated housings. Modules, cards, or blades (referred to herein as modules) are insertable into a shelf or chassis. The sealed housing refers to any of these physical embodiments.

Figure 4:
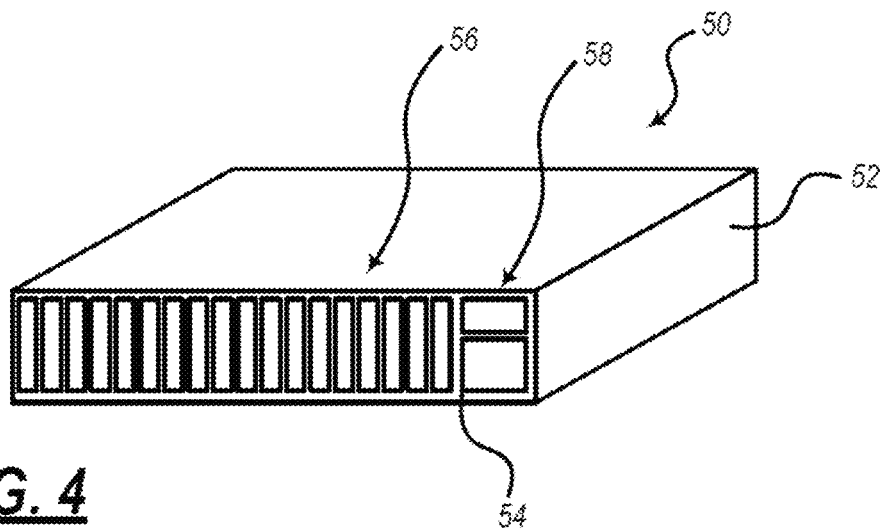
FIG. 4 is a perspective view of a networking device with a sealed housing.
Figure 5:
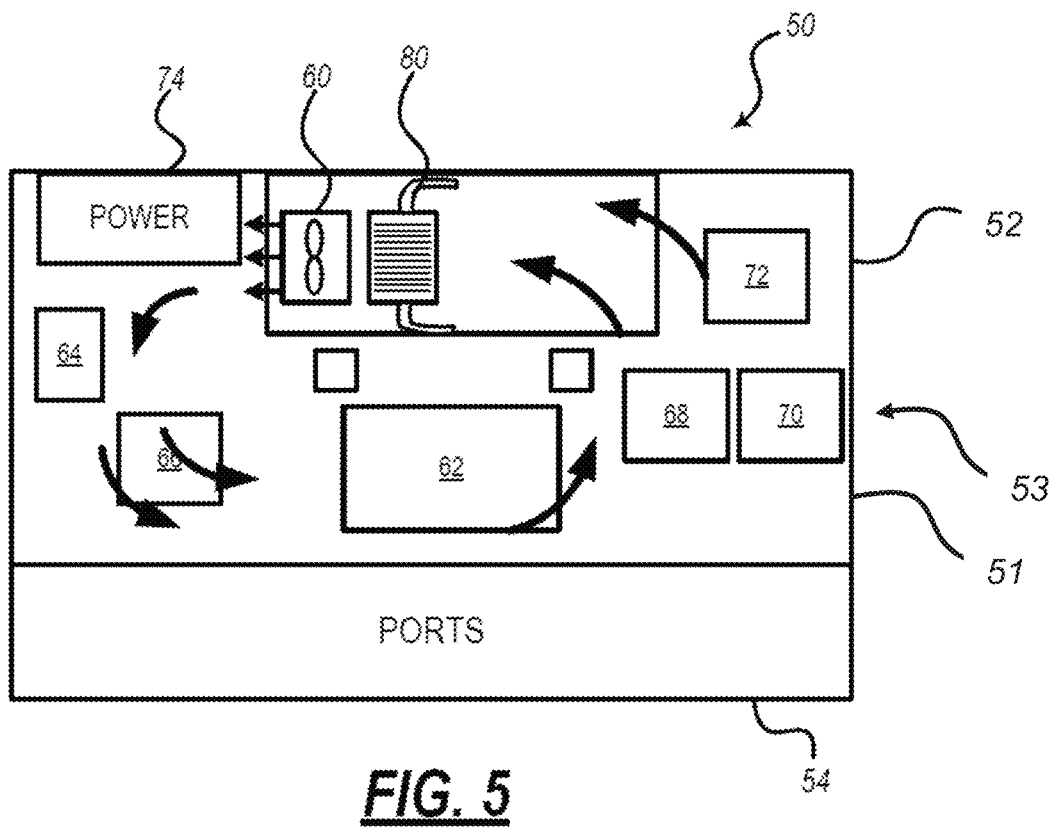
FIG. 5 is a top view of an interior of the networking device.

FIG. 4 is a perspective view of a networking device 50 with a sealed housing 52. Again, the networking device can be any physical embodiment of networking hardware, i.e., a module, a rack-mounted unit (pizza box), a chassis, a cabinet, etc. FIG. 5 is a top view of an interior of the networking device 50. For illustration purposes, the networking device 50 is a horizontal module or a rack-mounted unit (pizza box). Those skilled in the art will recognize the hybrid air and liquid cooling described herein can apply to any physical embodiment.

Of note, the term sealed housing 52 does not necessarily require a perfectly air-hermetic module, i.e., a small amount of air exchange with the outside environment is acceptable, but there is no air intake necessary. Rather, the sealed housing 52 is one that does not require dedicated space, such as on a faceplate 54, for air intake. As such, the faceplate 54 has more room for ports 56, status indicators 58 (e.g., displays, light emitting diodes (LEDs), etc.), and the like.

Because air is only or mainly circulated within the sealed housing 52, internal fans 60 are creating pressure differences internal to the device 50, not external to it so holes in the device 50 do not necessarily draw in lots of air. Also, the fans 60 do not require the same amount of force. The closed system means that dust is not an issue. In the case where air exchange with the outside is undesirable; for example, in a weather-resistant application, the device 50 may be well-sealed, and the approach described herein will still function without compromise.

In FIG. 5, the networking device 50 includes the ports 54, various circuits 62-72, and power 74, which can be on board 51, such as a printed circuit board (PCB). The fans 60 can include redundant fans to generate the interior airflow to increase reliability to be similar to the other components inside the device 50. Individual modules are generally considered single points of failure. In an embodiment, the interior fans 60 can be field-removable by locating them along the front or rear edge of the housing 52. For a pizza box (rack-mounted unit 53), they can be located near the top and bottom covers too.

Also, a circuit pack can mate to an external rear fan module such that together they form an enclosure for circulation of air. In this case, the external fan modules can have much smaller fans that would normally be required in a purely air-cooled scenario and thus make room to act as liquid distribution modules. The liquid distribution modules could take building water and provide it to the circuit packs in a redundant manner.

The networking device 50 includes one or more air-to-liquid heatsinks 80 or radiators placed in the path of the airflow as necessary. The objective here is to cool internal air in the housing 52 after it has flowed over any of the circuits 62-72. Of note, FIG. 5 illustrates a single air-to-liquid heatsink 80, but practical embodiments can include more than one.

In one embodiment, the air-to-liquid heatsink 80 is the PCB itself. Components such as the circuits 62-72 couple a substantial amount of heat into PCB's. A large heatsink such as a PCB can help reduce condensation issues. In another embodiment, the air-to-liquid heatsink is the metal enclosure of the housing 52. In another embodiment, an insulating layer is added between the enclosure and the exterior environment so that heating of the liquid lines by the exterior environment is minimized The networking device 50 includes sealed airflow circulation coupled with heat removal via liquid. As air flows around the inside of the device 50 in a closed loop, it picks up heat from board components (e.g., the circuits 62-72) and then releases that heat to a liquid-cooled heat exchanger (note, this term is used interchangeably with the air-to-liquid heatsink 80) in the air path so that the air is cooled and ready for the next cycle; the heat exits the closed-loop air system via liquid, not air. Each component can have a heatsink or not, depending on the operating temperature requirement of the component. On the word 'sealed', as noted in herein, its ok to have a small amount of air exchange with the outside world.

The fans 60 can have a variable speed determined by internal airflow sensor in circuit air path. Fan speed can be adjusted based on measured airflow, which reduces fan aging and delays fan failure.

Figure 6:
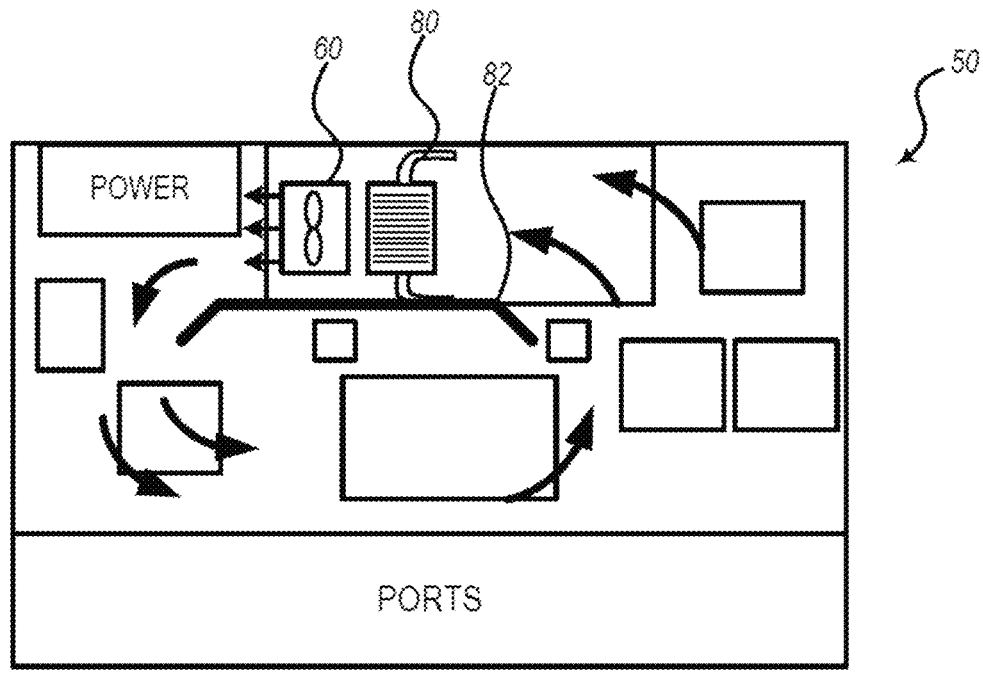
FIG. 6 is a top view of an interior of the networking device with a baffle include therein.
Figure 7:
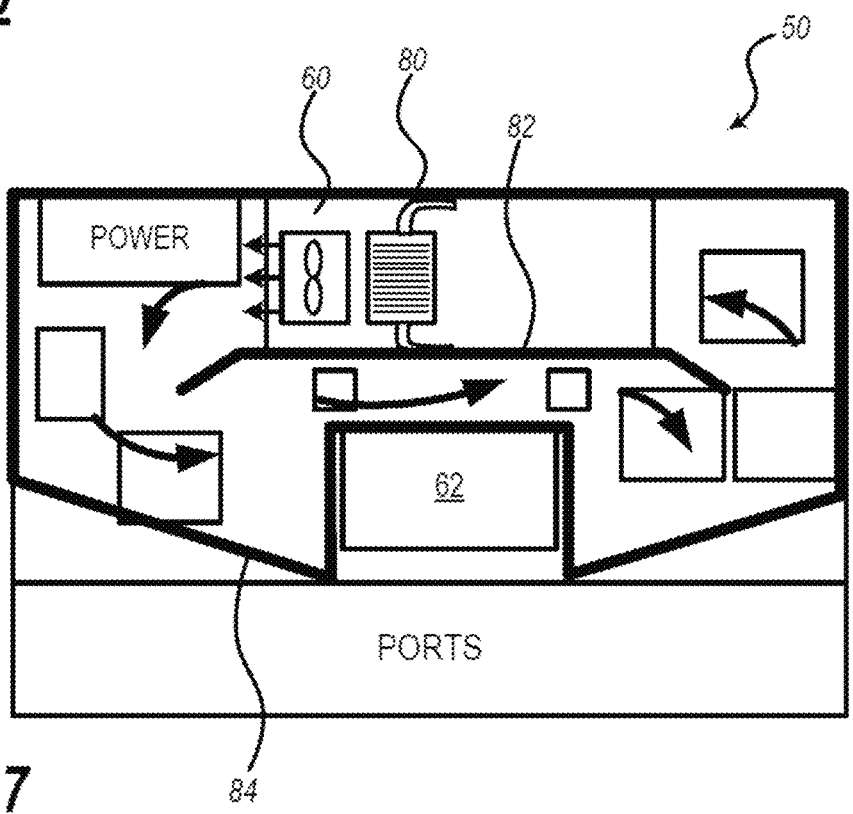
FIG. 7 is a top view of an interior of the networking device with the baffle and with a maze structure included therein.

FIG. 5 shows the airflow inside the networking device 50 in a circular manner. FIG. 6 is a top view of an interior of the networking device 50 with a baffle 82 included therein. FIG. 7 is a top view of an interior of the networking device 50 with the baffle 82 and with a maze structure 84 included therein. Air baffles 82 can be arranged to encourage airflow, namely to force the airflow to flow in a set direction such that cool air leaves the air-to-liquid heatsink 80 and hot air enters the air-to-liquid heatsink 80. The baffle can also serve to maximize local air speed in the region of one or more devices. The baffle 82 and the maze structure 84 can include any type of components, e.g., metal, the housing 52 itself, etc. In an embodiment, these components are part of the device 50 itself. That is, anything that can block air and direct it is contemplated.

Also, while the description has been to a sealed housing with an enclosed-loop airflow, this hybrid approach can also apply to non-enclosed airflow, such as a way to reduce the size and force of the fans in systems that rely on external airflow. In such an embodiment, the fresh cool air passes over some of the components, then passes over a liquid-cooled radiator, then over the rest of the components. Each component can have a heatsink or not, depending on the operating temperature requirement of the component. The radiator reduces pre-heating effects. By using external supply air, a dust filter would be part of that system. Also, it would require faceplate air holes, which consume faceplate room.

Also, the network device 50 is shown having a single housing 52. In a chassis, shelf, cabinet, etc., there can be multiple modules such as the networking device 50. In this embodiment, the networking device 50 can exclude the housing 52, rather the housing 52 is the shelf, chassis, cabinet, etc. In this manner, multiple devices 50 can work together in a sealed housing. That is, two or more field-replaceable modules can be joined by a chassis to form a closed-airflow circuit. Here, the fans 60 can be on the device 50 or in the chassis, shelf, cabinet, etc. Also, the air-to-liquid heatsinks 80 can be on the devices 50 as well. Those skilled in the art recognize there can be various physical embodiments, all having different directions of airflow, etc. As such, the term networking hardware is used to cover any of physical embodiment.

Further, the air and liquid cooling may not be required for all components inside the networking device. For example, the ports 54 can have their own liquid cooling and/or air cooled heatsinks. Also, in FIG. 7, the circuit 62 is shown excluded from the maze structure 84. Here, the circuit 62 can be a high-powered circuit that requires its own dedicated liquid cooling solution. The hybrid air and liquid cooling can focus on the other components (circuits 64-72) which it is not practical to dedicate their own cooling solution. Even further, this approach can reduce the size requirements for heat sinks on any of the circuits 62-72, thereby gaining additional space inside the networking device 50.

Condensation Control and Mitigation—In a non-sealed system, in the absence of mitigation, the air inside the networking device 50 will have the potential to absorb water vapor. If the temperature of the fins of the liquid-cooled heat exchanger 80 is below the dew point of the air inside the networking device 50, condensation will occur on the heat exchanger 80, and may pose a risk to electronics in the system.

Such risk is mitigated by one or more of the following approaches, including combinations:

The networking device 50 can include temperature and humidity monitoring to determine the dew point and to determine if condensation is at risk of occurring at any time The networking device 50 can include a technique to regulate the flow rate of the liquid through the heat exchanger such that the heat exchanger 80 is never below the dew point.

The networking device 50 can include regulation of the flow rate of the air in the air circuit (e.g., fan speed control) such that the heat exchanger 80 is never below the dew point.

The enclosure is sealed from the external environment with the exception of controlled openings. These openings can be covered with a membrane which allows water vapor to leave the enclosure, but not to enter the enclosure (e.g., Gortex). The enclosure is assembled such that the water vapor content inside is known and below a threshold. The threshold is selected such that under the range of the expected operating environments, the dew point cannot be reached.

Figure 8A:
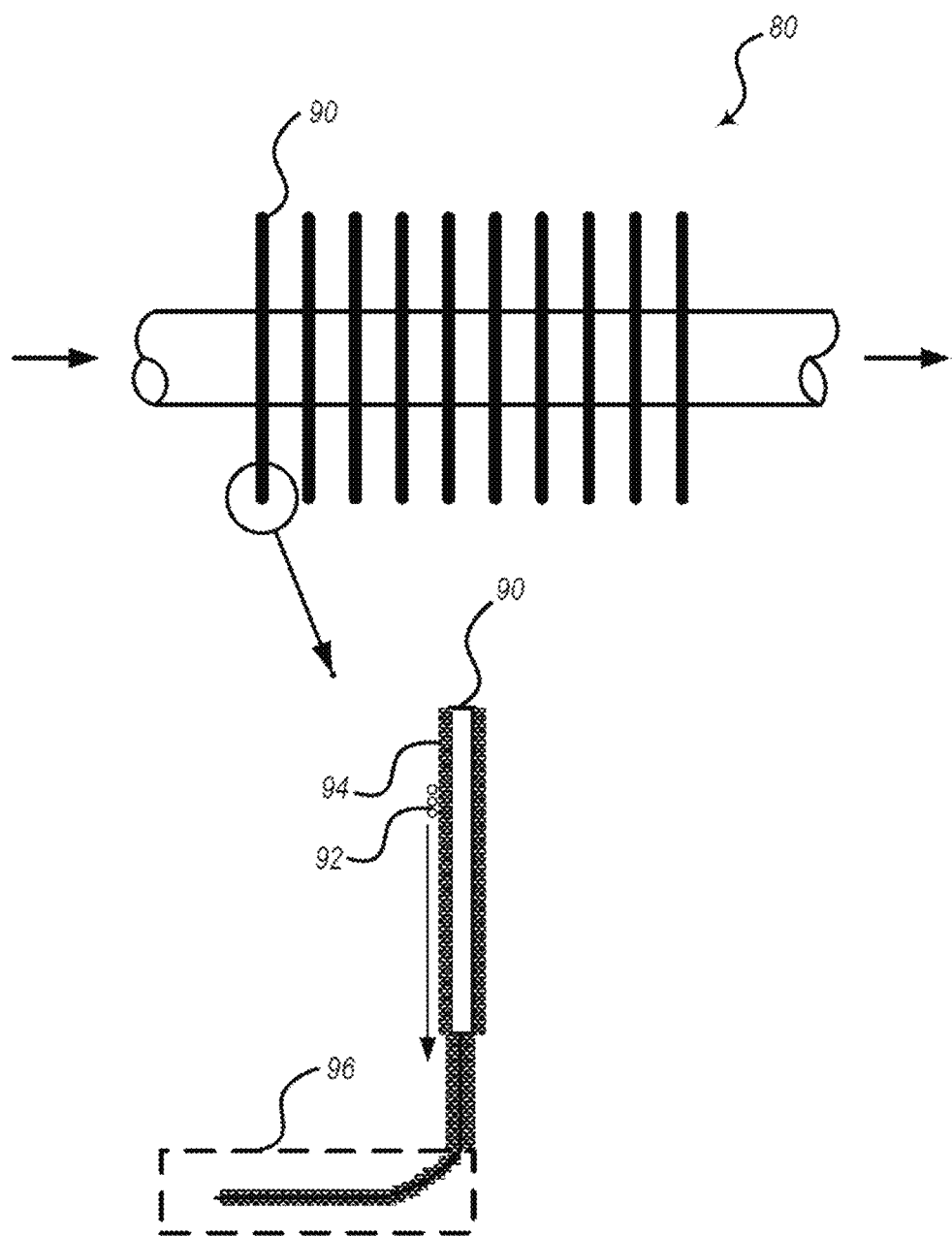
FIG. 8A is a diagram of the heat sink illustrating a close-up of one fin and an approach for controlling condensation.
Figure 8B:
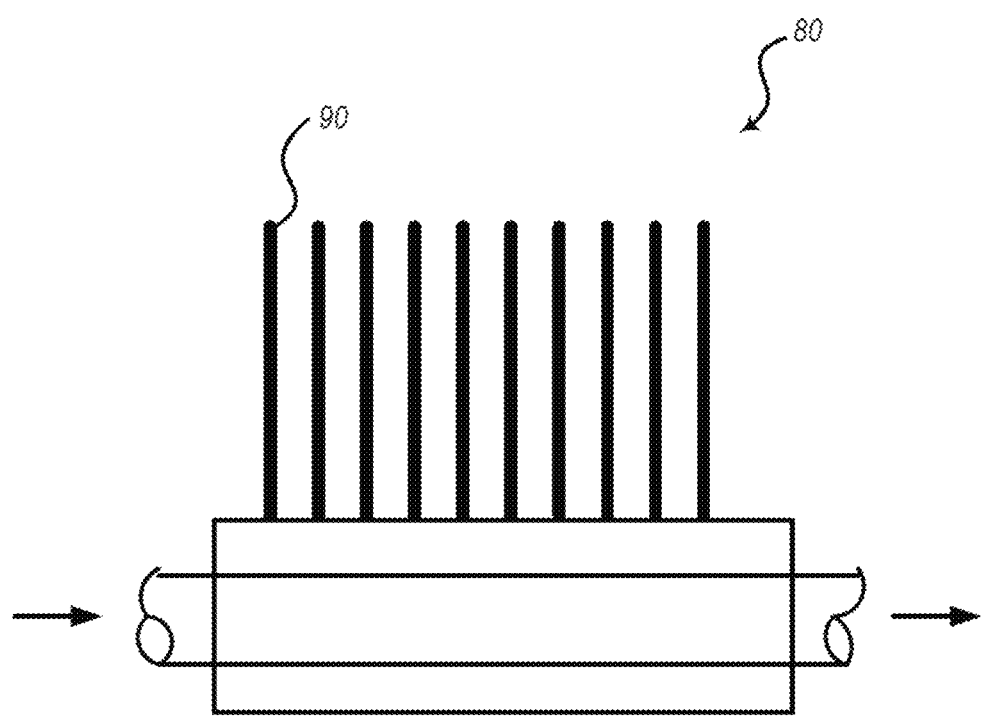
FIG. 8B is a diagram of another embodiment of the heat sink and fins.

In the case that condensate is formed, the condensate location is bounded and controlled in a manner such that it never a risk to the electronics. FIG. 8A is a diagram of the heat sink 80 illustrating a close-up of one fin 90 and an approach for controlling condensation, and FIG. 8B is a diagram of another embodiment of the heat sink 80. In FIG. 8A, the array of fins is directly coupled to the liquid tubing. In FIG. 8B, the array od fins or pins is coupled to a base plat in which the liquid tubing is embedded. Here, the cold surfaces of the heat exchanger—the tubing [FIG. 8B], fins 90, and baseplate (if used)—are coated with a hydrophilic wicking material 94 such as a mesh, powdered metal, parallel grooves, or other standard means to encourage the capture and movement of liquid via capillary action. The wick structure 94 runs continuously from the heat exchanger to the reservoir 96. The reservoir 96 is sized and positioned such that it is generally drier than the heat exchanger so that when condensate 92 forms on any member of the heat exchanger, the condensate 92 is wicked from the heat exchanger to the reservoir. The reservoir is positioned where the temperature is relatively warmer than the heat exchanger such that additional condensate does not form at the reservoir. The reservoir is also coated or fully-constructed of a hydrophilic wicking material so that it has a certain capacity to hold water. After some period of condensation formation at the heat exchanger, a certain amount of water is captured in the reservoir. At a later time, If/when the heat exchanger is above the dew point, the captured water is free to wick back toward the heat exchanger and evaporate back into the air. It is illustrated here to give an idea that condensate can be addressed in at least one way; there might be other ways. Also, this approach in FIG. 8 can be broader and does not have to be tied to a closed-air-loop system.

Figure 9:
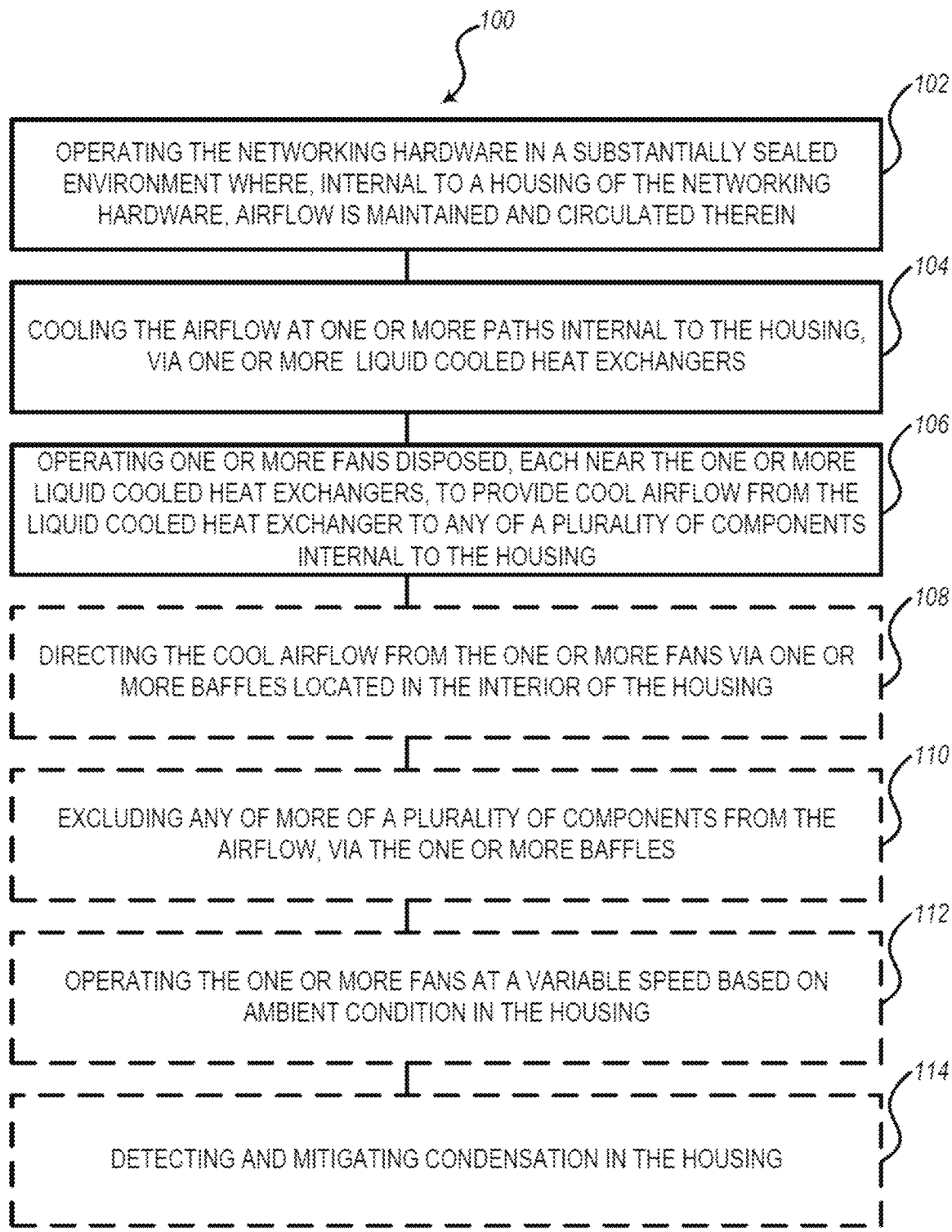
FIG. 9 is a flowchart of a process of operating networking hardware.

FIG. 9 is a flowchart of a process 100 of operating networking hardware. The process 100 contemplates implementation in any networking, storage, computing, etc. platform. Further, the process 100 contemplates networking hardware that can include any of a shelf, a chassis, a cabinet, a module, multiple modules in a housing, a rack-mounted unit (i.e., a pizza box), and the like.

The process 100 includes steps of operating the networking hardware in a substantially sealed environment where, internal to a housing of the networking hardware, airflow is maintained and circulated therein (step 102); cooling the airflow at one or more paths internal to the housing, via one or more liquid cooled heat exchangers (step 104); and operating one or more fans disposed, each near the one or more liquid cooled heat exchangers, to provide cool airflow from the liquid cooled heat exchanger to any of a plurality of components internal to the housing (step 106). The housing can include a faceplate with no air intake thereon.

The steps can further include directing the cool airflow from the one or more fans via one or more baffles located in the interior of the housing (step 108). The steps can further include excluding any of more of a plurality of components from the airflow, via the one or more baffles (step 110). The steps can further include operating the one or more fans at a variable speed based on ambient condition in the housing (step 112). The steps can further include detecting and mitigating condensation in the housing (step 114).

Also, of note, the hybrid liquid and air cooling does not necessarily perform better than external air cooling—as long as it performs comparable, the advantages significantly outweigh any of the performance decreases in terms of heat removal. That is, the benefits include lowered powered fans (less noise, less failure risk), no need for dust removal or air filtering, ability to place racks in a denser configuration, higher density on the housing for ports, displays, etc. It is further noted that external air-cooled systems require extra space in an office or data center for exhaust and air intake as well as high-powered air conditioning in these offices to cool the external air. The approached described herein reduces the air conditioning requirements as well as enables higher density rack placement, e.g., back-to-back and side-to-side.

Figure 10:
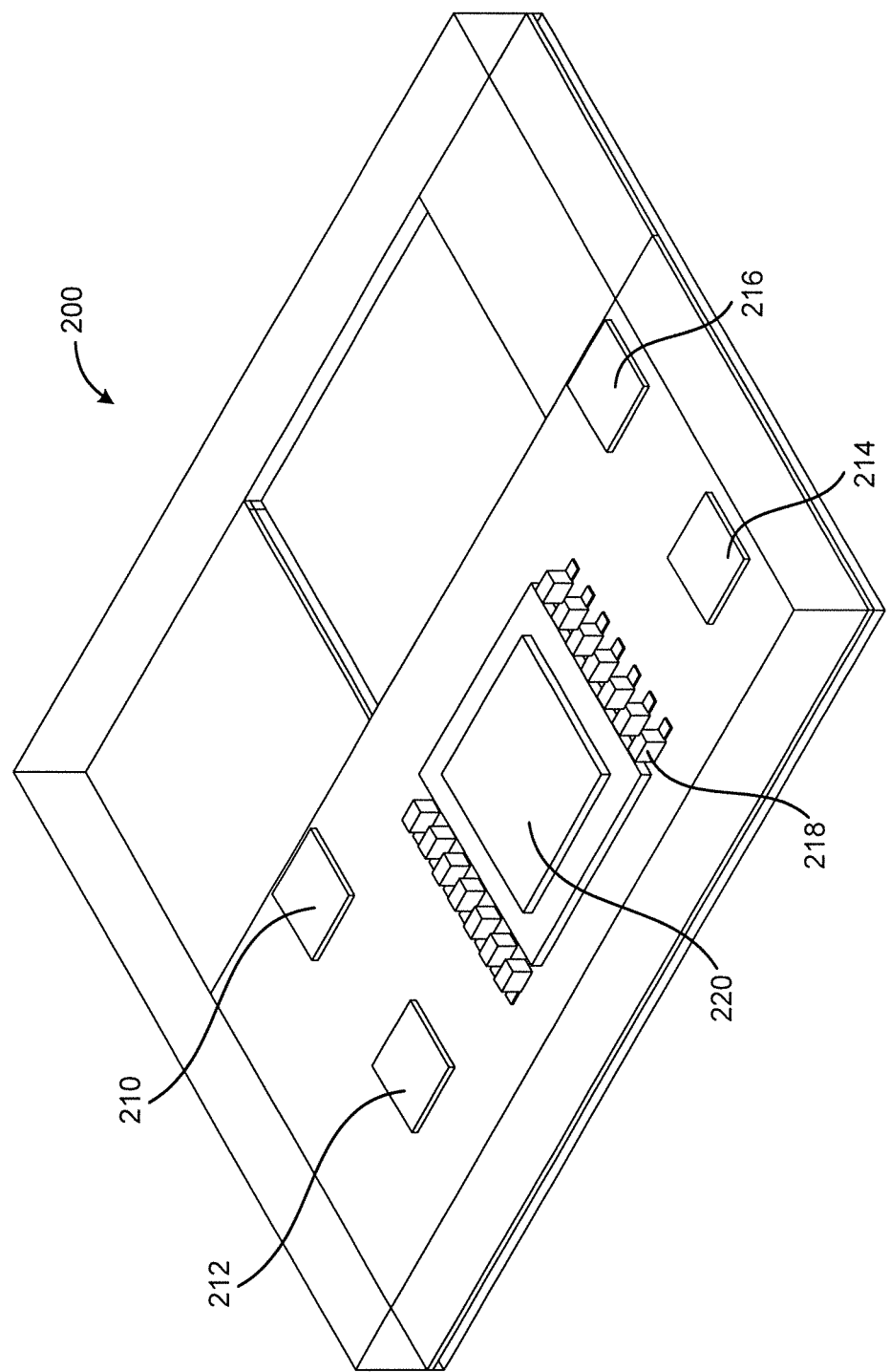
FIG. 10 is a diagram of an example module that is a 1U high rack-mounted unit ("pizza box").
Figure 11:
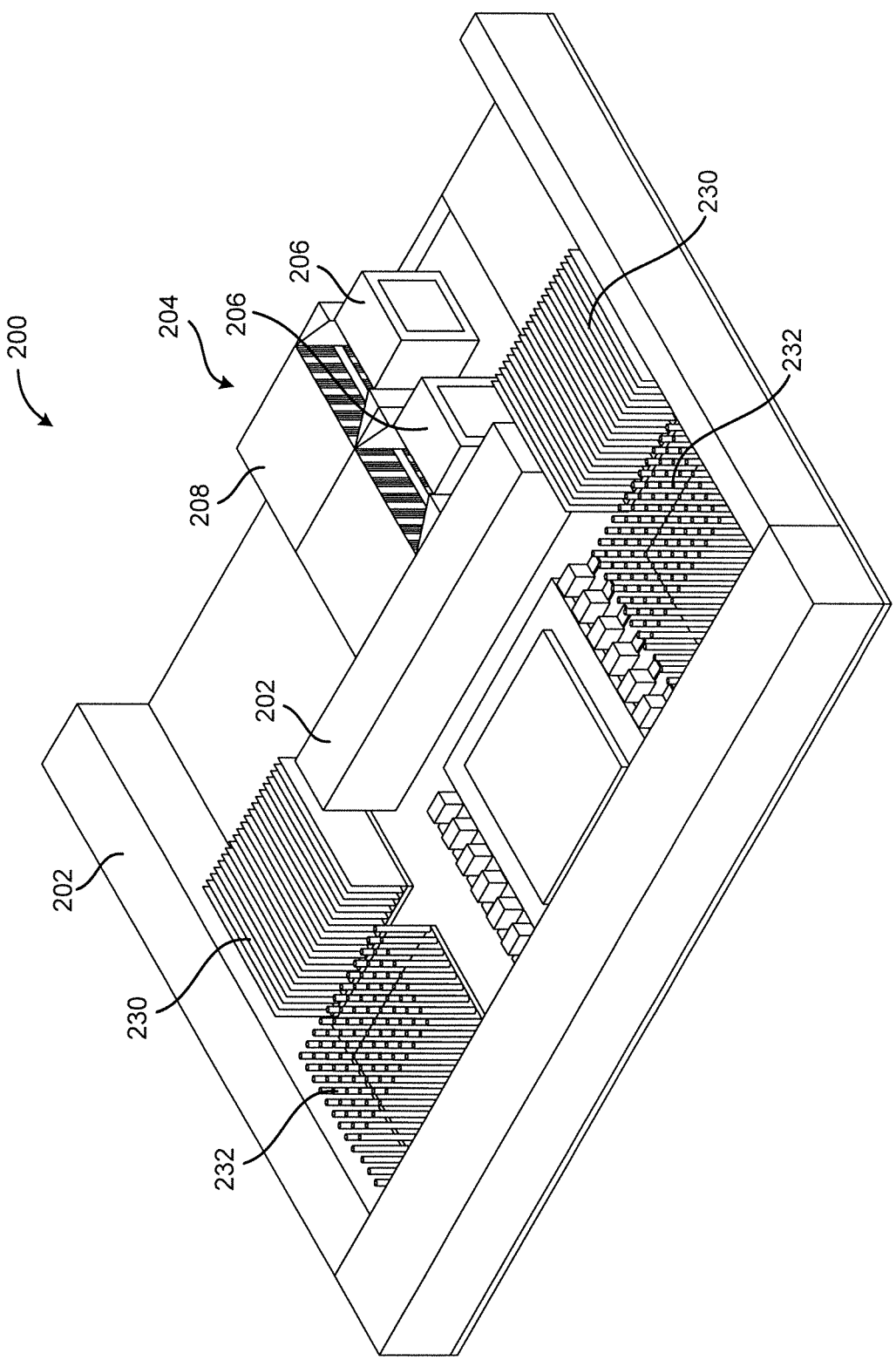
FIG. 11 is a diagram of the example module of FIG. 10 with baffles and a cooling unit including two fans and a liquid cooled heat exchanger.
Figure 12:
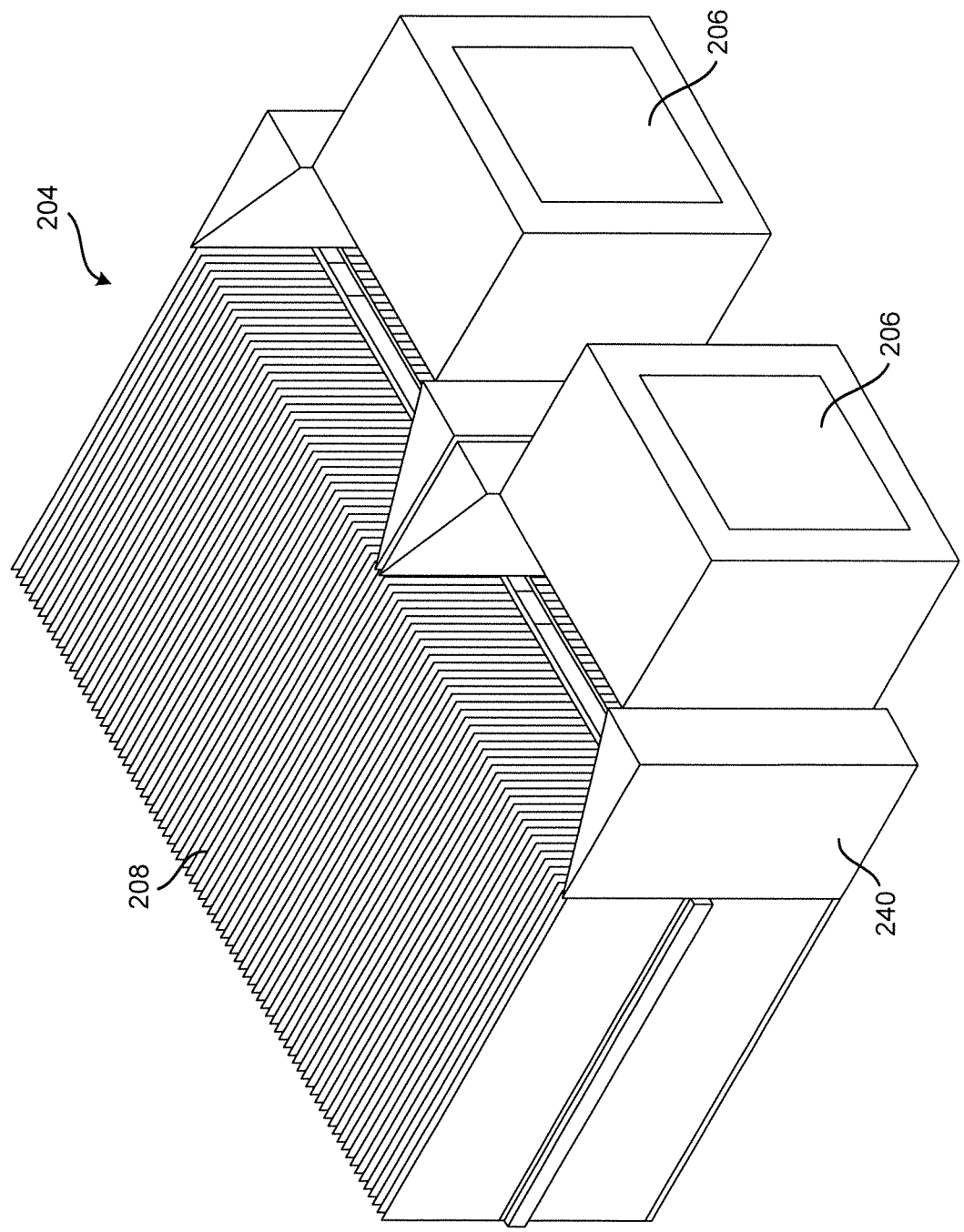
FIG. 12 is a close-up view of the cooling unit including two fans and a liquid cooled heat exchanger.
Figure 13:
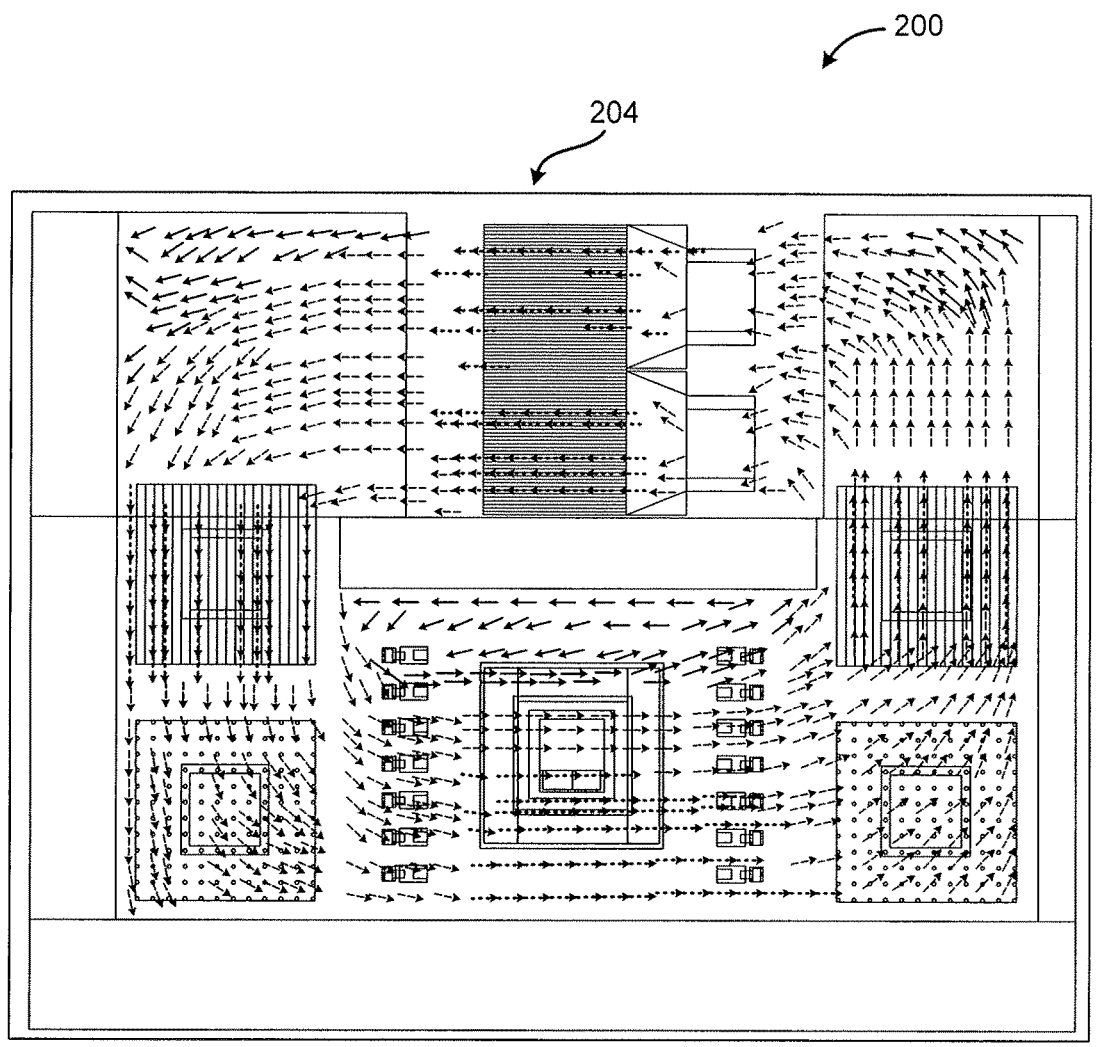
FIG. 13 is a top view of the example module of FIGS. 10-11 with the baffles illustrating air flow at a mid-height.
Figure 13:
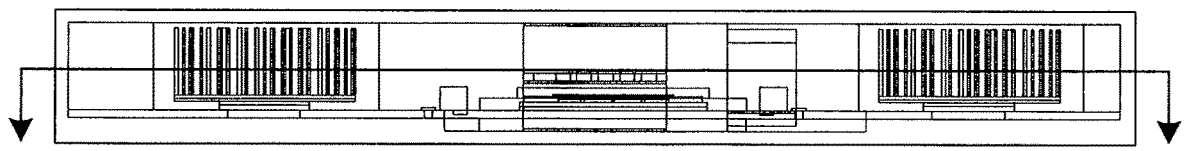
Figure 14:
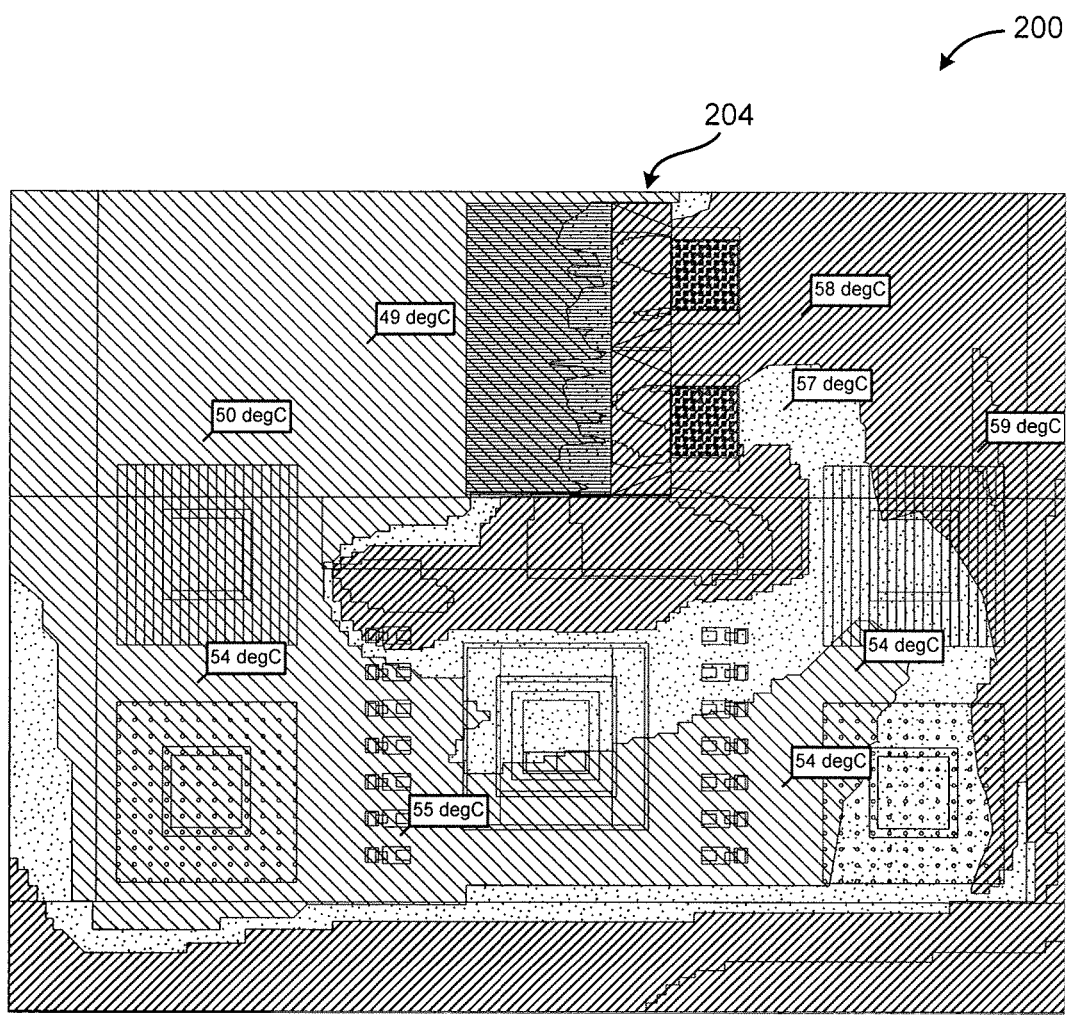
FIG. 14 is a top view of the example module of FIGS. 10-11 with the baffles illustrating temperature at a mid-height.
Figure 14:
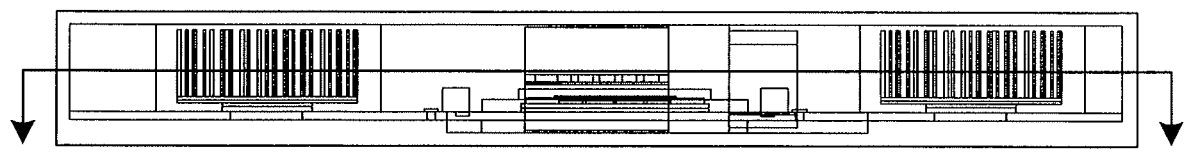

FIG. 10 is a diagram of an example module 200 that is a 1U high rack-mounted unit ("pizza box"). FIG. 11 is a diagram of the example module 200 with baffles 202 and a cooling unit 204 including two fans 206 and a liquid cooled heat exchanger 208. FIG. 12 is a close-up view of the cooling unit 204 including two fans 206 and a liquid cooled heat exchanger 208. FIG. 13 is a top view of the example module 200 with the baffles 202 illustrating air flow at a mid-height of the enclosure. FIG. 14 is a top view of the example module 200 with the baffles 202 illustrating temperature at a mid-height.

FIGS. 10-14 are presented to illustrate an example module 200 and performance to show that the hybrid air and liquid cooling can serve to cool such equipment using readily available materials. In an embodiment, the module 200 is about a 750 W system including devices 210, 212, 214, 216, 218, 220, in a 1U (1.75" tall) "pizza box" enclosure. 500 W comes from one high-power device 220 which can be independently cooled via a liquid-cooled cold-plate. The remaining power (~250 W) is dissipated by the devices 210-218 ranging in power from 2.4 W to 80 W. These devices 210-218 are air-cooled within an air circuit inside the enclosure.

The air circuit is itself cooled by a sub-assembly herein called the cooling unit 204, i.e., a Circulating Fan and Liquid-Cooled Heat Exchanger. A commercially available fan 206 was selected; two were used in parallel. Liquid supplied to the heat exchanger 208 is assumed to be 40° C.

In FIG. 11, two different types of heat sinks 230, 232 are used on the devices 210-216, based on the baffle 202 configuration. The devices 210, 216 include a plate fin heat sink 230 since they are located in a region between the baffles 202 where airflow is straight, i.e., through the plate fins. The devices 212, 214 include a pin fin heat sink 232 since they are located in a region between the baffles 202 where the airflow is curved, i.e., around the pin fins.

The baffles 202 can be any material that blocks/directs airflow, e.g., injection-molded plastic, blown-foam, etc. These parts serve to constrain the flow to a circuit, with the circulating fan 206 as the beginning and end point.

In FIG. 12, the cooling unit 204 can include one or more fans 206 and flow control parts 240 to ensure all air from the fans 206 is provided to the liquid cooled heat exchanger 208. The liquid cooled heat exchanger 208 can include a cold plate and fond array.

In FIGS. 13-14, a thermal simulation was run to model the thermal performance of the module 200. Device temperatures were all verified to be cooler than their respective maximum operating temperature limits. And thus, the viability of this approach is demonstrated.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A networking hardware system comprising:
   a housing;
   a board located in the housing, wherein the board includes a plurality of components;
   a liquid cooled heat exchanger, wherein the liquid cooled heat exchanger includes a portion of the board, is disposed on the board, or is disposed in an opening formed in the board;
   a hydrophilic wicking material coated on a plurality of fins of the liquid cooled heat exchanger and configured to wick condensate away from the liquid cooled heat exchanger;
   at least one fan disposed near the liquid cooled heat exchanger, wherein the at least one fan is configured to provide cool airflow from the liquid cooled heat exchanger to at least one of the plurality of components; and
   a condensation collection system to maintain any condensate away from the plurality of components, the condensation collection system including:
      a reservoir, wherein the hydrophilic wicking material extends continuously from the liquid cooled heat exchanger to the reservoir such that condensate is wicked from the liquid cooled heat exchanger to the reservoir, and
      wherein the reservoir is at least one of coated with or fully constructed of a further hydrophilic wicking material such that, when a temperature of the heat exchanger is above a dew point of the provided cool airflow, the condensate wicked to the reservoir is wicked back to the liquid cooled heat exchanger to evaporate the condensate into the provided cool airflow.

2. The networking hardware system of claim 1, wherein the housing is substantially sealed from an external environment.

3. The networking hardware system of claim 1, wherein the housing excludes air filtering for dust based on being substantially sealed from an external environment.

4. The networking hardware system of claim 1, wherein the at least one fan is further configured to circulate the cool airflow in a closed loop.

5. The networking hardware system of claim 4, wherein the closed loop includes a pressure differential internal to the housing for circulating the cool airflow.

6. The networking hardware system of claim 1, wherein the housing includes a faceplate with substantially no air intake therefrom.

7. The networking hardware system of claim 1, wherein the liquid cooled heat exchanger includes one or more of
   a heat sink with an optional base, the plurality of fins and a liquid cooling pipe therein, and
   a liquid cooling pipe.

8. The networking hardware system of claim 1, further comprising
   one or more baffles located in an interior of the housing and positioned to direct the cool airflow within the housing.

9. The networking hardware system of claim 8, wherein the one or more baffles are positioned to exclude some of the plurality of components from the cool airflow.

10. The networking hardware system of claim 1, wherein the networking hardware system is a chassis having the housing and the board is a module inserted into the chassis.

11. The networking hardware system of claim 1, wherein the networking hardware system is a rack-mounted unit.

12. The networking hardware system of claim 1, wherein the at least one fan is further configured to operate at a variable speed based on ambient condition in the housing.

13. The networking hardware system of claim 1, further comprising
   a condensation detection and mitigation system.

14. The networking hardware system of claim 13, wherein the condensation detection and mitigation system is configured to control, based on a reading of an included temperature sensor, the at least one fan to keep the liquid cooled heat exchanger above a dew point.

15. A method of operating networking hardware, comprising steps of:

operating the networking hardware in a substantially sealed environment where, internal to a housing of the networking hardware including a board, airflow is maintained and circulated therein;

cooling the airflow at one or more paths internal to the housing, via one or more liquid cooled heat exchangers, wherein the one or more liquid cooled heat exchangers each includes a portion of the board, is disposed on the board, or is disposed in an opening formed in the board;

wicking condensate from the one or more liquid cooled heat exchangers via a hydrophilic wicking material coated on a plurality of fins of the one or more liquid cooled heat exchangers to a condensation collection system; and operating at least one fan disposed, each near the one or more liquid cooled heat exchangers, to provide cool airflow from the liquid cooled heat exchanger to at least one a plurality of components internal to the housing, wherein the condensation collection system is configured to maintain any condensate away from the plurality of components, the condensation collection system including:
   a reservoir, wherein the hydrophilic wicking material extends continuously from the liquid cooled heat exchanger to the reservoir such that condensate is wicked from the liquid cooled heat exchanger to the reservoir, and
   wherein the reservoir is at least one of coated with or fully constructed of a further hydrophilic wicking material such that, when a temperature of the heat exchanger is above a dew point of the provided cool airflow, the condensate wicked to the reservoir is wicked back to the liquid cooled heat exchanger to evaporate the condensate into the provided cool airflow.

16. The method of claim 15, wherein the housing includes a faceplate with substantially no air intake therefrom.

17. The method of claim 15, wherein the steps include directing the cool airflow from the at least one fan via one or more baffles located in the interior of the housing.

18. The method of claim 17, wherein the steps include excluding any or more of a plurality of components from the cool airflow, via the one or more baffles.

19. The method of claim 15, wherein the steps include operating the at least one fan at a variable speed based on ambient condition in the housing.

* * * * *